(12) United States Patent
Yeh et al.

(10) Patent No.: US 8,716,731 B2
(45) Date of Patent: *May 6, 2014

(54) TUNABLE PHOSPHOR FOR LUMINESCENT (75) Inventors: Chiao-Wen Yeh, Taitung (TW); Ru-Shi Liu, Shulin (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 130 days.

This patent is subject to a terminal disclaimer.

(21) Appl. No.: 13/084,135

(22) Filed: Apr. 11, 2011

(65) Prior Publication Data

US 2012/0256212 A1 Oct. 11, 2012

(51) Int. Cl.
H01L 33/44 (2010.01)
(52) U.S. Cl.
USPC ..................................... 257/98; 257/E33.061
(58) Field of Classification Search
USPC ............................................ 257/98, E33.061
See application file for complete search history.

(56) References Cited

U.S. PATENT DOCUMENTS

| | | | |
|---|---|---|---|
| 6,649,946 B2 | 11/2003 | Bogner et al. | |
| 7,391,060 B2 * | 6/2008 | Oshio | 257/98 |
| 2006/0220047 A1 | 10/2006 | Nagatomi et al. | |
| 2010/0200874 A1 * | 8/2010 | Shioi et al. | 257/91 |

FOREIGN PATENT DOCUMENTS

WO WO2006/061778 A1 6/2006

OTHER PUBLICATIONS

Rong-Jun Xie et al., "Photoluminescence of $(Ba_{1-x}Eu_x)Si_6N_8O$ ($0.005 \leq x \leq 0.2$) phosphors", Journal of Luminescence 130 (2010), 2009 Elsevier B.V., pp. 266-269.
Florian Stadler et al., "Synthesis, Crystal Structure and Solid-State NMR Spectroscopic Investigation of the Oxonitridosilicate $BaSi_6N_8O$", 2005, Wiley-VCH, pp. 1773-1778.
C.J. Duan et al., "Preparation, Electronic Structure, and Photoluminescence Properties of $Eu^{2+}$-and $Ce^{3+}/Li^+$-Activated Alkaline Earth Silicon Nitride $MsiN_2$ (M=Sr, Ba)", Chem. Mater. © XXXX American Chemical Society, Published on Web Jan. 3, 2008, pp. A-I.
R. Le Toquin et al., "Red-Emitting Cerium-Based Phosphor Materials for Solid-State Lighting Applications", Science Direct, 2006 Elsevier B.V., Chemical Physics Letters 423 (2006) pp. 352-356.
Florian Stadler et al., "$SrSi_6N_8$—A Reduced Nitridosilicate with a Si—Si Bond", 2005 Wiley-VCH, Angew. Chem. Int. Ed. 2005, 44, pp. 657-570.

(Continued)

*Primary Examiner* — Matthew W Such
*Assistant Examiner* — Monica D Harrison
(74) *Attorney, Agent, or Firm* — Haynes and Boone, LLP (57) ABSTRACT

The present disclosure provides an illuminating system including a light emitting diode (LED); and a tunable luminescent material disposed approximate the light-emitting diode, wherein the tunable luminescent material includes alkaline earth metal (AE) and silicon aluminum nitride doped by a rare earth element (RE), formulated as $(AE)Si_{6-p}Al_pN_8$, wherein p is a parameter defining a relative aluminum content in weight and p is greater than zero.

21 Claims, 8 Drawing Sheets

(56) References Cited

OTHER PUBLICATIONS

Florian Stadler et al., "The Reduced Nitridosilicate $BaSi_6N_8$", 2007, Wiley-VCH, InterScience, pp. 589-592.

Y.Q. Li et al., "The Effect of Replacement of Sr by Ca on the Structural and Luminescence Properties of the Red-Emitting $Sr_2Si_5N_8:Eu^{2+}$ LED Conversion Phosphor", Journal of Solid State Chemistry 181 (2008), Elsevier, Science Direct, pp. 515-524.

Kousuke Shioi et al., "Luminescence Properties of $SrSi_6N_8:Eu^{2+}$" Springer Science+Business Media, LLC 2008, J Mater Sci (2008) 43:5659-5661.

* cited by examiner

| Mixing composition (% by weight) | | | | | | | | |
|---|---|---|---|---|---|---|---|---|
| Example | Compound | $Sr_3N_2$ | $Si_3N_4$ | AlN | EuN | Temperature | Time(h) | Pressure(MPa) |
| 1 | $Sr_{0.99}Si_6N_8:Eu_{0.01}$ | 25.47 | 74.48 | 0 | 0.4 | 1900 | 3 | 0.9 |
| 2 | $Sr_{0.99}(Si_{5.8}Al_{0.2})N_8:Eu_{0.01}$ | 25.45 | 71.94 | 2.19 | 0.4 | 1900 | 3 | 0.9 |
| 3 | $Sr_{0.99}(Si_{5.6}Al_{0.4})N_8:Eu_{0.01}$ | 25.53 | 69.66 | 4.36 | 0.4 | 1900 | 3 | 0.9 |
| 4 | $Sr_{0.99}(Si_{5.4}Al_{0.6})N_8:Eu_{0.01}$ | 25.61 | 67.38 | 6.56 | 0.4 | 1900 | 3 | 0.9 |
| 5 | $Sr_{0.99}(Si_{5.2}Al_{0.8})N_8:Eu_{0.01}$ | 25.69 | 65.09 | 8.78 | 0.4 | 1900 | 3 | 0.9 |
| 6 | $Sr_{0.99}(Si_5Al_1)N_8:Eu_{0.01}$ | 25.77 | 62.78 | 11 | 0.4 | 1900 | 3 | 0.9 |
| 7 | $Sr_{0.99}(Si_{4.8}Al_{1.2})N_8:Eu_{0.01}$ | 25.85 | 60.45 | 13.25 | 0.4 | 1900 | 3 | 0.9 |

Peak wavelength and intensity of excitation emission spectra

| Sample | Excitation wavelength (nm) | Excitation intensity | Emission wavelength (nm) | Emission intensity | Half Width at Half Maximum (HWHM) |
|---|---|---|---|---|---|
| 1 | 370 | 1.33E+08 | 452 | 1.13E+08 | 40 |
| 2 | 370 | 1.78E+08 | 452 | 1.12E+08 | 42 |
| 3 | 370 | 1.03E+08 | 460 | 7.18E+07 | 89 |
| 4 | 370 | 1.24E+08 | 508 | 7.62E+07 | 92 |
| 5 | 370 | 4.26E+07 | 518 | 2.59E+07 | 212 |
| 6 | 370 | 1.36E+08 | 510 | 8.19E+07 | 101 |
| 7 | 370 | 5.82E+07 | 604 | 4.41E+07 | 137 |

# TUNABLE PHOSPHOR FOR LUMINESCENT

CROSS-REFERENCE TO RELATED APPLICATIONS

The present disclosure is related to the following commonly-assigned U.S. patent application, the entire disclosure of which is incorporated herein by reference: U.S. patent application Ser. No. 12/938,221 filed Nov. 2, 2010 by inventors Chiao-Wen Yeh et al. for "A Phosphor with Ce3+/Ce3+, Li+ Doped Luminescent Materials".

BACKGROUND

Light-emitting diode (LED) lighting typically uses nitridosilicate and oxonitridosilicate materials to enhance color rendering index (CRI) and chemical stability. WO Patent Application Publication No. 2006/061778 by Philips discloses an oxonitridosilicate phosphor of $(Sr_{1-x-y}Ca_{x}Ba_{y})_{2-z}Al_{b}Si_{12-b}N_{16-b}O_{a+b}:Eu_{z}$, which emits blue light. For white illumination applications, a second phosphor that emits red light, such as from yellow to red, is required. Furthermore, according to the formula of WO 2006/061778, the presence of oxygen is required when aluminum is present. In particular, nitridosilicates without oxygen have high condensed frameworks, and thus, have stable chemical structures and exhibit thermal stability.

Therefore, a nitride phosphor material having a proper emission spectrum and a method of making the same to enhance LED color shifting is needed to address various issues identified above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Figure 1:
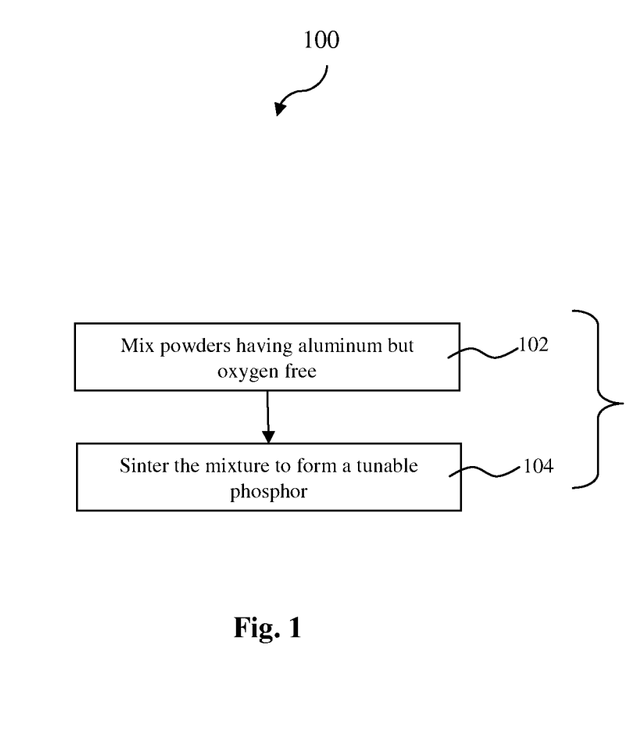
FIG. 1 is a flowchart of a method for forming a tunable luminescent material constructed according to various aspects of the present disclosure in one or more embodiments.

FIG. 1 is a flowchart of a method 100 for making a luminescent material (or tunable phosphor) constructed according to various aspects of the present disclosure. The present disclosure provides a luminescent material having desired excitation spectrum and emission spectrum to enhance a radiation source's performance. Particularly, the disclosed luminescent material has an emission spectrum and an excitation spectrum tunable with the aluminum content, and may thus be referred to as a tunable luminescent material. With further reference to FIGS. 3-7, the luminescent material and method of making the same are collectively described below.

The method 100 begins by mixing precursors stoichiometrically at step 102. The precursors are provided in powders. In one embodiment, the precursors are grounded in a mortar under argon atmosphere. The precursors include strontium nitride ($Sr_3N_2$), silicon nitride ($Si_3N_4$), aluminum nitride (AlN), and europium nitride (EuN). The powdered strontium nitride, silicon nitride, aluminum nitride, and europium nitride are mixed according to certain composition ratios, forming a mixture free of oxide. For example, powdered strontium nitride, silicon nitride, aluminum nitride, and europium nitride are mixed in percentages by weight of 25.45, 71.94, 2.19, and 0.4, respectively, as shown in the second row of a table 106 in FIG. 3.

The method 100 proceeds to step 104 by sintering the mixture, forming a tunable nitridosilicate (or silicon nitride) luminescent material in powder. The tunable nitridosilicate luminescent material includes strontium silicon aluminum nitride doped by europium ($Eu^{2+}$) (or europium activated strontium silicon aluminum nitride) having a formula of $SrSi_{6-p}Al_pN_8:Eu^{2+}$, where "p" is a parameter defining the relative composition contents of aluminum and silicon in weight. If the total weight of silicon and aluminum is 1, the relative weight of aluminum is p and the relative weight of silicon is 6−p. The parameter "p" is greater than zero. In one embodiment, the parameter "p" is greater than zero and is less than 1.2, formulated as 0<p≤1.2. In another embodiment, the parameter "p" is greater than zero and is less than 3, formulated as 0<p≤3. Particularly, the tunable luminescent material has various compositions defined in a compositional formula as $Sr_{1-z}Si_{6-p}Al_pN_8:Eu^{2+}{}_z$, where z is a parameter defining the relative composition contents of strontium and europium in weight. If the total weight of the alkaline earth metal and the rare earth element is 1, the relative weight of the rare earth element is z and the relative weight of the alkaline earth metal is 1−z. In one embodiment, the parameter z ranges between about 0.001 and about 0.4, formulated as 0.001≤z≤0.4. In an example associated with the second row of table 106 of FIG. 3, the parameter z is 0.01 and the parameter p is 0.2. In this case, the corresponding compositional formula is $Sr_{0.99}(Si_{5.8}Al_{0.2})N_8:Eu^{2+}{}_{0.01}$.

The sintering of the mixture at step 104 is implemented in a nitrogen atmosphere with a high temperature and a high pressure. In one embodiment, the high temperature ranges between about 1700° C. and about 2300° C. In another embodiment, the high pressure ranges between about 0.7 MPa and about 1.2 MPa. In the present embodiment, the high temperature is about 1900° C., and the high pressure is about 0.90 MPa as shown in the second row of table 106. The sintering at step 104 has a duration greater than about 0.5 hour. In one embodiment, the sintering duration ranges between about 0.5 hours and about 6 hours. In the present embodiment, the sintering duration is about 3 hours as shown in the first row of table 106.

Figure 3:
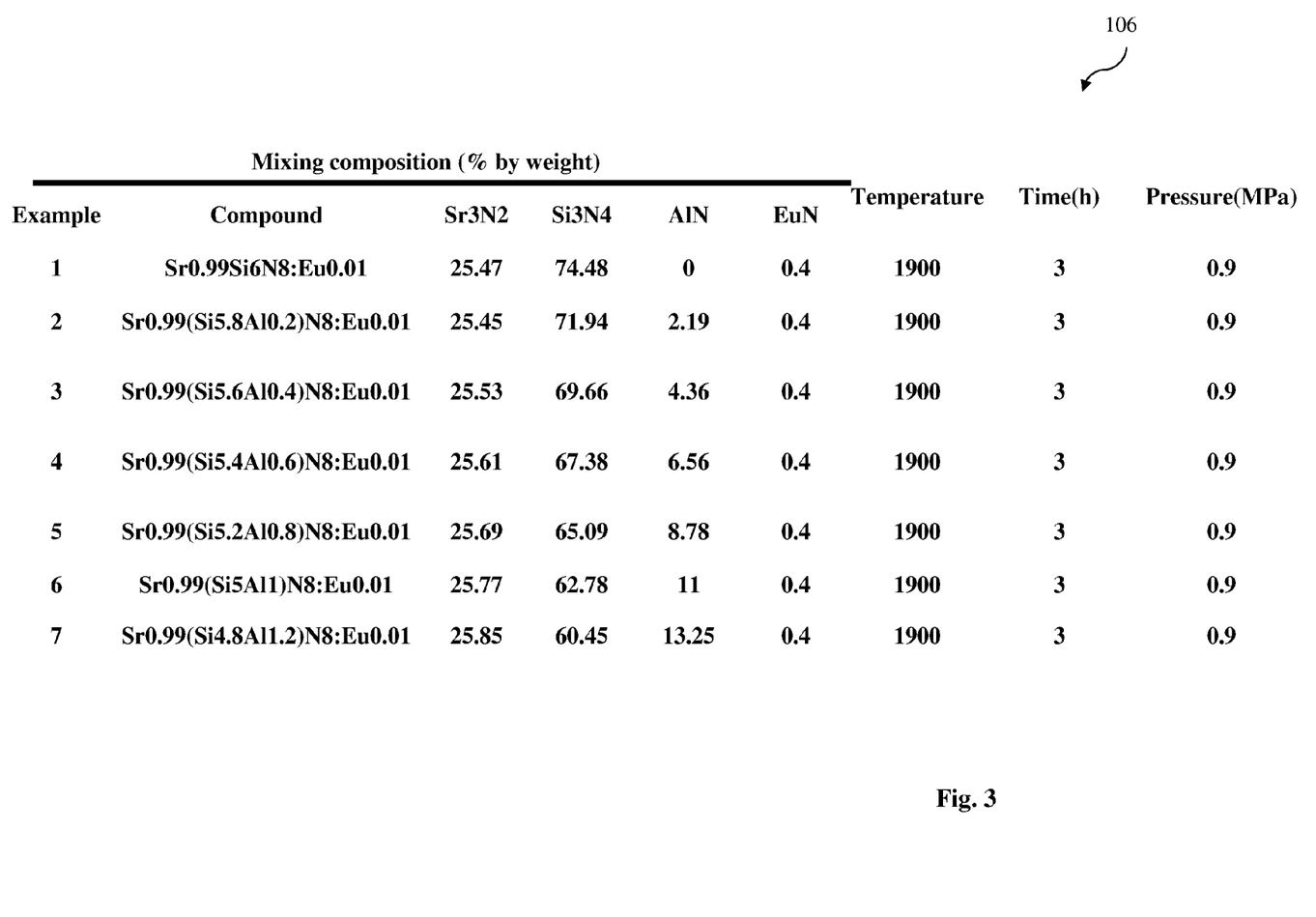
FIG. 3 is a table of compositions and parameters for making the tunable luminescent material by the method of FIG. 1 in various embodiments.
Figure 4:
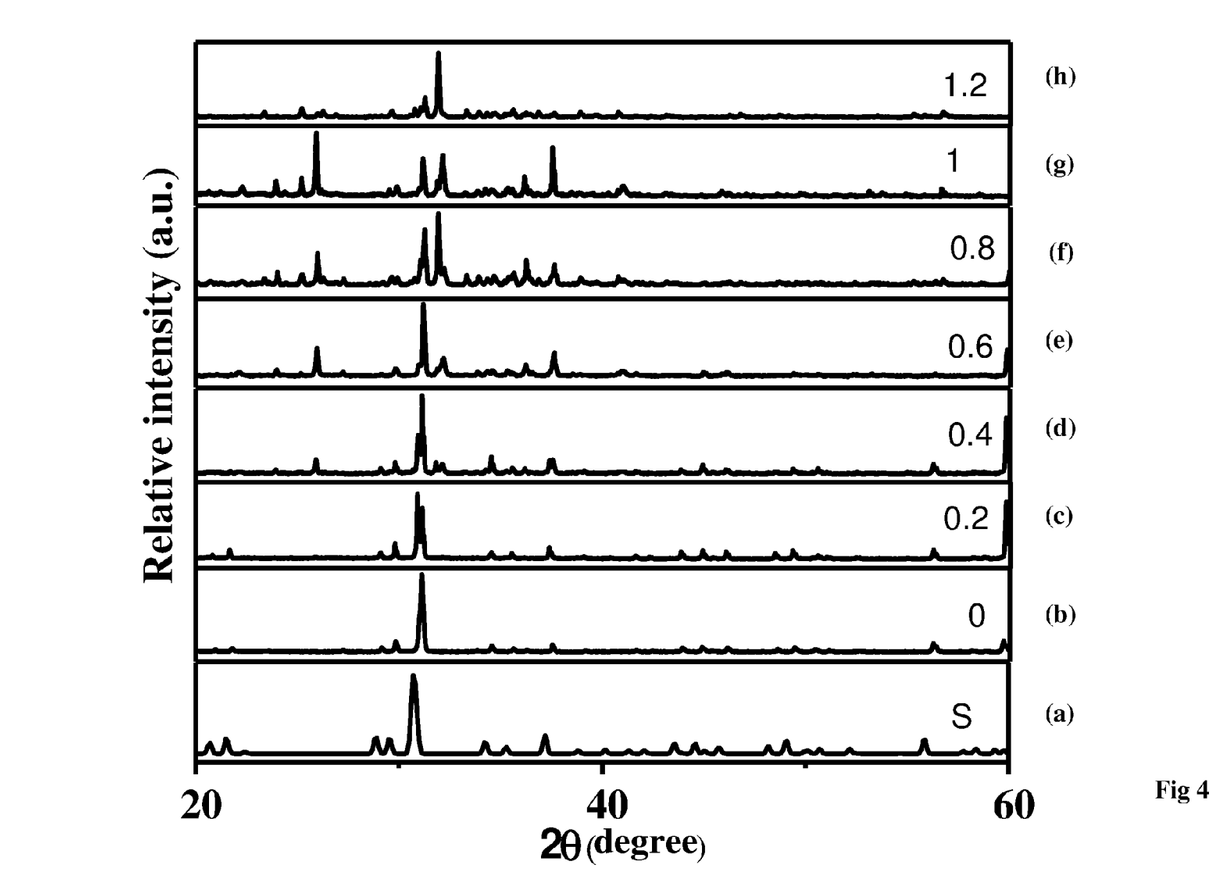
FIG. 4 includes charts characterizing the tunable luminescent materials in various embodiments.

In one example, the formed tunable nitridosilicate luminescent material $Sr_{0.99}Si_{5.8}Al_{0.2}N_8:Eu^{2+}_{0.01}$ has been investigated by x-ray using Bragg diffraction techniques as illustrated in FIG. 4 (c) and labeled as "0.2" in the figure legend. The tunable luminescent material of FIG. 4 (c) is formulated as $Sr_{1-z}Si_{6-p}Al_pN_8:Eu^{2+}_z$ with z being 0.01 and p being 0.2, or $Sr_{0.99}Si_{5.8}Al_{0.2}N_8:Eu^{2+}_{0.01}$, corresponding to the luminescent material formed using the compositions and parameters provided in the second row of table 106 of FIG. 3. The diffraction pattern is drawn as the scattering intensity (in arbitrary units) versus 2θ, where θ is the scattering angle.

The present disclosure also provides another embodiment of the nitridosilicate luminescent material and method of making the same as described below. Still referring to FIG. 1, the method 100, in this embodiment, includes step 102 for mixing various precursors stoichiometrically. The precursors are provided in powder. In one embodiment, the precursors are grounded in a mortar under argon atmosphere. The precursors include an alkaline earth metal-containing compound, a silicon-containing compound, an aluminum-containing compound and a rare earth element-containing compound. An alkaline earth metal is a metal in the second group of the periodic table of the elements. In one embodiment, the alkaline earth metal used in the precursor includes strontium (Sr), calcium (Ca), barium (Ba), or combinations thereof. In furtherance of the embodiment, the alkaline earth metal-containing compound in the precursors includes strontium nitride ($Sr_3N_2$), calcium nitride ($Ca_3N_2$), barium nitride ($Ba_3N_2$), or a combination thereof. In another embodiment, the silicon-containing compound includes silicon nitride ($Si_3N_4$). In another embodiment, the aluminum-containing compound includes aluminum nitride (AlN). In another embodiment, the rare earth element used in the precursors includes europium and the rare earth element-containing compound includes europium nitride (EuN). In one example, the precursors include a combination of $Sr_3N_2$, $Ca_3N_2$, and $Ba_3N_2$, $Si_3N_4$, AlN, and EuN. The powdered $Sr_3N_2$, $Ca_3N_2$, and $Ba_3N_2$, $Si_3N_4$, AlN, and EuN are mixed according to certain composition ratios, forming a mixture free of oxide.

The method 100 includes step 104 for sintering the mixture, forming a tunable nitridosilicate luminescent material in powder. The sintering of the mixture at step 104 is implemented in a nitrogen atmosphere with a high temperature and a high pressure. In one embodiment, the high temperature ranges between about 1700° C. and about 2300° C. In another embodiment, the high pressure ranges between about 0.7 MPa and about 1.2 MPa. The sintering at step 104 has a duration greater than about 0.5 hour. In one embodiment, the sintering duration ranges between about 0.5 hours and about 6 hours.

The tunable nitridosilicate luminescent material includes alkaline earth metal silicon nitride doped by rare earth element, formulated as $(Sr_{1-x-y}Ca_xBa_y)_{1-z}Si_{6-p}Al_pN_8:RE_z$, where "RE" represents a rare earth element. In the present embodiment, the rare earth element includes europium (Eu). The corresponding tunable nitridosilicate luminescent material is formulated as $(Sr_{1-x-y}Ca_xBa_y)_{1-z}Si_{6-p}Al_pN_8:Eu_z$ or particularly $(Sr_{1-x-y}Ca_xBa_y)_{1-z}Si_{6-p}Al_pN_8:Eu^{2+}_z$. In a particular embodiment, the tunable luminescent material has various compositions defined in the compositional formula $(Sr_{1-x-y}Ca_xBa_y)_{1-z}Si_{6-p}Al_pN_8:Eu_z$, or $(Sr_{1-x-y}Ca_xBa_y)_{1-z}Si_{6-p}Al_pN_8:Eu^{2+}_z$, where the parameters x, y, z, and p define relative composition contents in weight. Specifically, z is a parameter defining the relative composition contents of the alkaline earth metal and the rare earth element in weight. If the total weight of the alkaline earth metal and the rare earth element is 1, the relative weight of the rare earth element is z and the relative weight of the alkaline earth metal is 1−z. Similarly, the parameters x and y define the relative composition contents of various alkaline earth metals in weight. If the total weight of the alkaline earth metals is 1, the relative weight of calcium is x, the relative weight of barium is y, and the relative weight of strontium is 1−x−y. The parameter p defines the relative composition contents of silicon and aluminum in weight. If the total weight of silicon and aluminum is 1, the relative weight of aluminum is p and the relative weight of silicon is 6−p.

In one embodiment, the parameter p is greater than zero and is less than about 1.2, formulated as $0<p\leq 1.2$. In another embodiment, the parameter p is greater than zero and is less than about 3, formulated as $0<p\leq 3$. In yet another embodiment, the parameter x ranges between 0 and 1, formulated as $0\leq x\leq 1$, and the parameter y ranges between 0 and 1, formulated as $0\leq y\leq 1$. In yet another embodiment, the parameter z ranges between about 0.001 and about 0.4, formulated as $0.001\leq z\leq 0.4$.

In an example associated with the second row of table 106 of FIG. 3, the formed tunable luminescent material is represented by the formula $(Sr_{1-x-y}Ca_xBa_y)_{1-z}Si_{6-p}Al_pN_8:RE_z$, where RE is europium, x and y are zero, z is 0.01, and p is 0.2. In this case, the corresponding compositional formula is $Sr_{0.99}(Si_{5.8}Al_{0.2})N_8:Eu^{2+}_{0.01}$. The sintering process to form the tunable luminescent material $Sr_{0.99}(Si_{5.8}Al_{0.2})N_8:Eu^{2+}_{0.01}$ in the present example includes a high temperature of about 1900° C., a high pressure of about 0.90 MPa, and a sintering duration of about 3 hours.

Other examples are provided in FIG. 3 according to various embodiments of the present disclosure. One example is shown in the third row of table 106. The precursors include strontium nitride ($Sr_3N_2$), silicon nitride ($Si_3N_4$), aluminum nitride (AlN), and europium nitride (EuN). The powdered strontium nitride, silicon nitride, aluminum nitride and europium nitride are mixed in weight percentages of 25.53, 69.66, 4.36, and 0.4, respectively. In this example, the sintering temperature is about 1900° C.; the nitrogen pressure is about 0.90 MPa; and the sintering duration is about 3 hours. The formed tunable nitridosilicate luminescent material $Sr_{0.99}Si_{5.6}Al_{0.4}N_8:Eu^{2+}_{0.01}$ has been investigated by x-ray using Bragg diffraction techniques as illustrated in FIG. 4(d). The diffraction pattern is drawn as the scattering intensity (in arbitrary units) versus 2θ.

Another example is shown in the fourth row of table 106. The precursors include strontium nitride, silicon nitride, aluminum nitride, and europium nitride. The powdered strontium nitride, silicon nitride, aluminum nitride, and europium nitride are mixed in weight percentages of 25.61, 67.38, 6.56, and 0.4, respectively. In this example, the sintering temperature is about 1900° C.; the nitrogen pressure is about 0.90 MPa; and the sintering duration is about 3 hours. The formed tunable nitridosilicate luminescent material $Sr_{0.99}Si_{5.4}Al_{0.6}N_8:Eu^{2+}_{0.01}$ has been investigated by x-ray using Bragg diffraction techniques as illustrated in FIG. 4(e). The diffraction pattern is drawn as the scattering intensity (in arbitrary units) versus 2θ.

Another example is shown in the fifth row of table 106. The precursors include strontium nitride, silicon nitride, aluminum nitride, and europium nitride. The powdered strontium nitride, silicon nitride, aluminum nitride, and europium nitride are mixed in weight percentages of 25.69, 65.09, 8.78, and 0.4, respectively. In this example, the sintering temperature is about 1900° C.; the nitrogen pressure is about 0.90 MPa; and the sintering duration is about 3 hours. The formed tunable nitridosilicate luminescent material $Sr_{0.99}Si_{5.2}Al_{0.8}N_8:Eu^{2+}_{0.01}$ has been investigated by x-ray using Bragg diffraction techniques as illustrated in FIG. 4(f). The diffraction pattern is drawn as the scattering intensity (in arbitrary units) versus 2θ.

Another example is shown in the sixth row of table 106. The precursors include strontium nitride, silicon nitride, aluminum nitride, and europium nitride. The powdered strontium nitride, silicon nitride, aluminum nitride, and europium nitride are mixed in weight percentages of 25.77, 62.78, 11, and 0.4, respectively. In this example, the sintering temperature is about 1900° C.; the nitrogen pressure is about 0.90 MPa; and the sintering duration is about 3 hours. The formed tunable nitridosilicate luminescent material $Sr_{0.99}Si_5Al_1N_8:Eu^{2+}_{0.01}$ has been investigated by x-ray using Bragg diffraction techniques as illustrated in FIG. 4(g). The diffraction pattern is drawn as the scattering intensity (in arbitrary units) versus 2θ.

Another example is shown in the seventh row of table 106. The precursors include strontium nitride, silicon nitride, aluminum nitride, and europium nitride. The powdered strontium nitride, silicon nitride, aluminum nitride, and europium nitride are mixed in weight percentages of 25.85, 60.45, 13.25, and 0.4, respectively. In this example, the sintering temperature is about 1900° C.; the nitrogen pressure is about 0.90 MPa; and the sintering duration is about 3 hours. The formed tunable nitridosilicate luminescent material $Sr_{0.99}Si_{4.8}Al_{1.2}N_8:Eu^{2+}_{0.01}$ has been investigated by x-ray using Bragg diffraction techniques as illustrated in FIG. 4(h). The diffraction pattern is drawn as the scattering intensity (in arbitrary units) versus 2θ.

The first row of table 106 in FIG. 3 is associated with a sample without aluminum as a reference for comparison and analysis. In this sample, the precursors include strontium nitride, silicon nitride, and europium nitride. The powdered strontium nitride, silicon nitride, and europium nitride are mixed in weight percentages of 25.47, 74.48, and 0.4, respectively. In this example, the sintering temperature is about 1900° C.; the nitrogen pressure is about 0.90 MPa; and the sintering duration is about 3 hours. The formed tunable nitridosilicate luminescent material $Sr_{0.99}Si_6N_8:Eu^{2+}_{0.01}$ has been investigated by x-ray using Bragg diffraction techniques as illustrated in FIG. 4(b). The diffraction pattern is drawn as the scattering intensity (in arbitrary units) versus 2θ.

The diffraction pattern of a reference sample $SrSi_6N_8$ is provided in FIG. 4(a). The x-ray using Bragg diffraction pattern is drawn as the scattering intensity (in arbitrary units) versus 2θ in FIG. 4(a).

The tunable nitridosilicate (or nitride) phosphor formed by the method 100 is rare earth element doped such as europium ($Eu^{2+}$) doped. The tunable nitridosilicate materials formed by the method 100 includes aluminum and can emit light with an emission spectrum tunable by the content of the aluminum composition, and are therefore referred to as tunable nitridosilicate phosphors doped by rare earth element (such as europium). Furthermore, the tunable nitridosilicate materials formed by the method 100 includes an excitation spectrum tunable by the content of the aluminum composition. In one embodiment, the tunable nitridosilicate phosphors include an emission spectrum peak ranging from about 440 nm to about 650 nm when the content of the aluminum composition is tuned to be less than about 1.2, or p<1.2. In another embodiment, the tunable nitridosilicate phosphors includes an excitation spectrum ranging from about 300 nm to about 450 nm when the content of the aluminum composition is tuned to be less than about 0.6, or p<0.6. In yet another embodiment, the tunable nitridosilicate phosphors includes an excitation spectrum ranging from about 300 nm to about 500 nm when the content of the aluminum composition is tuned to be greater than about 0.6, or p>0.6.

The present disclosure provides a tunable nitridosilicate phosphor. The tunable nitridosilicate phosphor includes an alkaline earth metal (AE), silicon nitride, aluminum nitride, and is doped by a rare earth element (RE). The tunable nitridosilicate phosphor has an emission spectrum tunable by the content of the aluminum composition. The tunable luminescent material is represented by the formula $(AE)Si_{6-p}Al_pN_8:RE_z$, where AE is an alkaline earth metal, such as strontium (Sr), calcium (Ca), barium (Ba), or combinations thereof. RE is a rare earth element, such as europium (Eu or $Eu^{2+}$). In one embodiment, the tunable luminescent material is represented by the formula $(Sr_{1-x-y}Ca_xBa_y)_{1-z}Si_{6-p}Al_pN_8:RE_z$. In a particular embodiment, the tunable luminescent material is represented by the formula $(Sr_{1-x-y}Ca_xBa_y)_{1-z}Si_{6-p}Al_pN_8:Eu_z$. The parameter p is greater than zero. In one embodiment, the parameter p is less than about 1.2, formulated as 0<p≤1.2. In another embodiment, the parameter p is less than about 3, formulated as 0<p≤3. In yet another embodiment, the parameter x ranges between 0 and 1, formulated as 0≤x≤1, and the parameter y ranges between 0 and 1, formulated as 0≤y≤1. In yet another embodiment, the parameter z ranges between about 0.001 and about 0.4, formulated as 0.001≤z≤0.4.

Various advantages may be present in one or more embodiments of the tunable nitridosilicate phosphor (($Sr_{1-x-y}Ca_xBa_y)_{1-z}Si_{6-p}Al_pN_8:RE_z$, or $(Sr_{1-x-y}Ca_xBa_y)_{1-z}Si_{6-p}Al_pN_8:Eu_z$). For example, the disclosed tunable nitridosilicate phosphors can emit light spanning from red to blue. Further, high condensed frameworks of the nitridosilicate phosphors provide chemical structure stability and thermal stability. Traditionally, nitride phosphors emit more red light than oxide phosphors based on nephelauxetic effects and crystal field splitting. The disclosed phosphors are not only suitable as red emitting sources but are also suitable as blue to red emitting sources for white light emitting diodes.

In one embodiment, the strontium nitridosilicate phosphor $(Sr_{1-x-y}Ca_xBa_y)_{1-z}Si_{6-p}Al_pN_8:RE_z$, or $(Sr_{1-x-y}Ca_xBa_y)_{1-z}Si_{6-p}Al_pN_8:Eu_z$, emits visual light tunable from blue to red under proper excitation, such as from ultraviolet (UV) to blue excitation. In furtherance of the embodiment, the tunable nitridosilicate phosphors includes an emission spectrum peak ranging from about 440 nm to about 650 nm is achieved by tuning the content of the aluminum composition (for example, in a range of 0<p<1.2). In another embodiment, the range of the excitation wavelength is between about 300 nm and about 500 nm. In yet another embodiment, the range of the excitation wavelength is between about 300 nm and about 450 nm is achieved by tuning the content of the aluminum composition (for example, in a range of 0<p<0.6). In yet another embodiment, the tunable strontium nitridosilicate phosphor emits a broad emission band with a tunable wavelength range, by the content of the aluminum composition, from a first wavelength range (about 400 nm to about 500 nm) to a second wavelength range (about 450 nm to about 800 nm).

WO Patent Application Publication No. 2006/061778 by Philips disclosed an oxonitridosilicate phosphor of $(Sr_{1-x-y}Ca_xBa_y)_{2-z}Al_bSi_{12-b}N_{16-b}O_{a+b}:Eu_z$. First, the phosphor $(Sr_{1-x-y}Ca_xBa_y)_{2-z}Al_bSi_{12-b}N_{16-b}O_{a+b}:Eu_z$ requires the presence of oxygen when aluminum is present. The phosphor $(Sr_{1-x-y}Ca_xBa_y)_{2-z}Al_bSi_{12-b}N_{16-b}O_{a+b}:Eu_z$ is an oxonitridosilicate compound instead of a nitridosilicate compound. The disclosed nitridosilicate phosphors, which lack oxygen, have high condensed frameworks, and thus, have more stable chemical structures and exhibit thermal stability when compared to conventional oxonitridosilicate phosphors. Second, oxonitridosilicate phosphors emit blue light and are not tunable. For white illumination applications, a second phosphor that emits red light, such as from yellow to red, is required.

U.S. Pat. No. 6,649,946 discloses yellow to red emitting nitride phosphors doped by europium (Eu), such as $(Ca,Sr,Ba)_xSi_yN_z:Eu$ ($z=\frac{2}{3}x+\frac{4}{3}y$), which is synthesized at normal pressure. This phosphor does not include aluminum, and its emission light is not tunable. In contrast, the tunable nitridosilicate phosphors provided in the present disclosure are synthesized at a high pressure. Further, the tunable nitridosilicate phosphors in the present disclosure are rare earth element-doped nitride phosphors with aluminum content but free of oxygen. Such tunable nitridosilcate phosphors can emit red to blue light.

Figure 5:
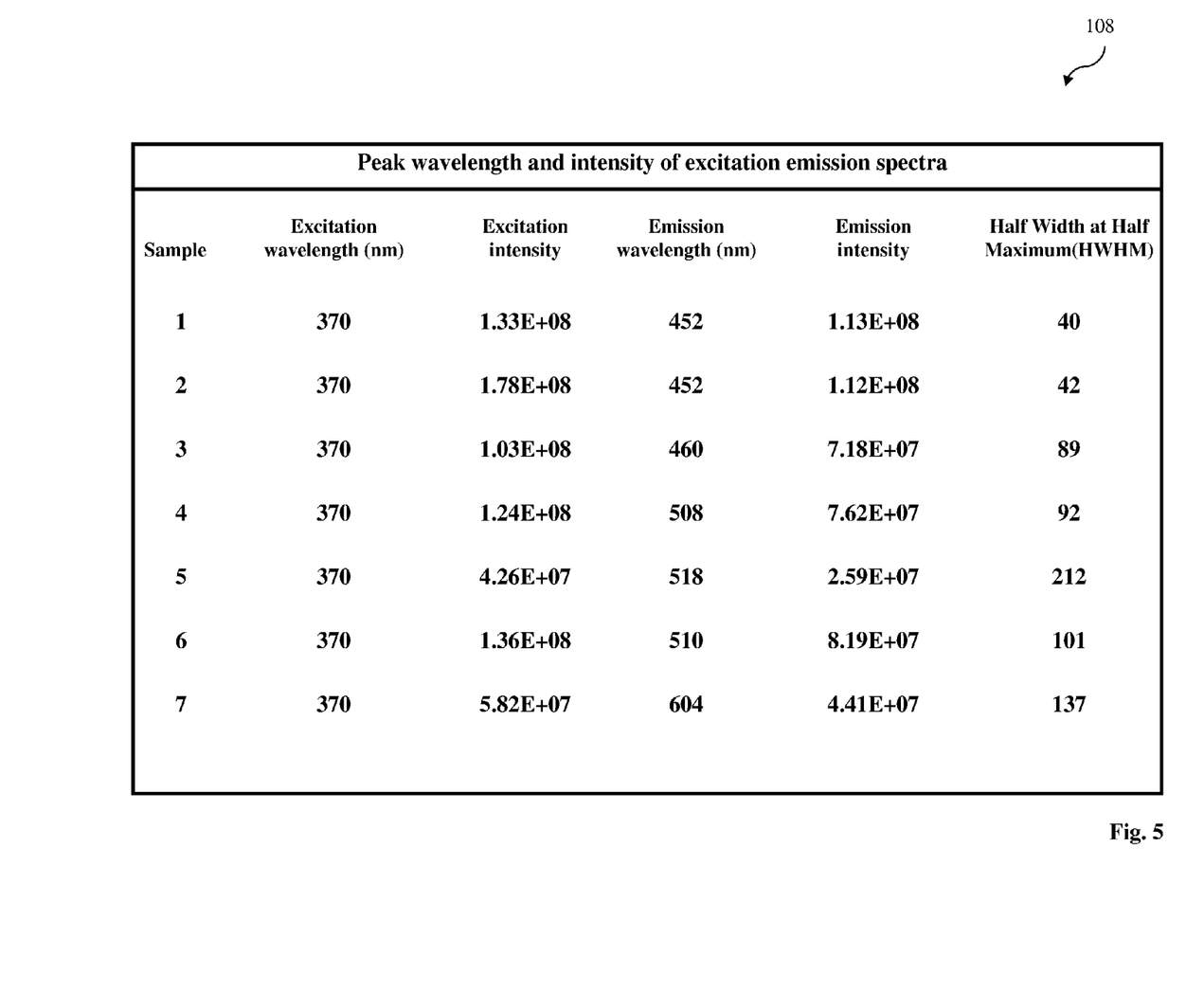
FIG. 5 is a table having characterization data of the tunable luminescent materials in various embodiments.

FIG. 5 is a table 108 providing characteristic data of europium ($Eu^{2+}$) doped nitridosilicate phosphor samples in various embodiments. Particularly, the table 108 provides peak wavelength and intensity of excitation of the six examples listed from the second row to seventh row in mixing composition table 106 of FIG. 3. The table 108 also provides half width at half maximum (HWHM) and intensity of emission of the corresponding six examples. The tunable nitridosilicate phosphors in the six examples are formed by the method 100 with the corresponding compositions listed in table 106 of FIG. 3. The six examples labeled as 2, 3, . . . , 7 in table 108, respectively, correspond with the six examples labeled as 2, 3, 4, . . . , 7 in table 106 of FIG. 3. Additionally, a sample without aluminum composition is provided in the first rows of FIG. 3 and FIG. 5 as a reference. More specifically, table 108 includes excitation peak wavelength (in nanometer or nm), excitation peak intensity (in arbitrary units or a.u.), emission peak wavelength (nm), emission peak intensity (a.u.), and half width at half maximum.

Example 2 is further described in detail according to table 108 for illustration. In example 2, the tunable nitridosilicate phosphor is prepared by the method 100 having mixing compositions and sintering parameters provided in the second row of table 106 in FIG. 3. The tunable nitridosilicate phosphor in example 2 is europium ($Eu^{2+}$) doped strontium nitridosilicate phosphor with a formula of $Sr_{1-z}Si_{1-p}Al_pN_8:Eu^{2+}_z$, where z is 0.01 and p=0.2, thus providing the formula ($Sr_{0.99}Si_{5.8}Al_{0.2}N_8:Eu^{2+}_{0.01}$). The tunable nitridosilicate phosphor in example 2 emits blue light under UV excitation. Particularly, the nitridosilicate phosphor in example 2 has an excitation peak wavelength at about 370 nm; an excitation peak intensity of $1.78\times10^8$; an emission peak wavelength at 452 nm; an emission peak intensity of $1.13\times10^8$; and HWHM at 40, as provided in the second row of table 108.

Figure 6:
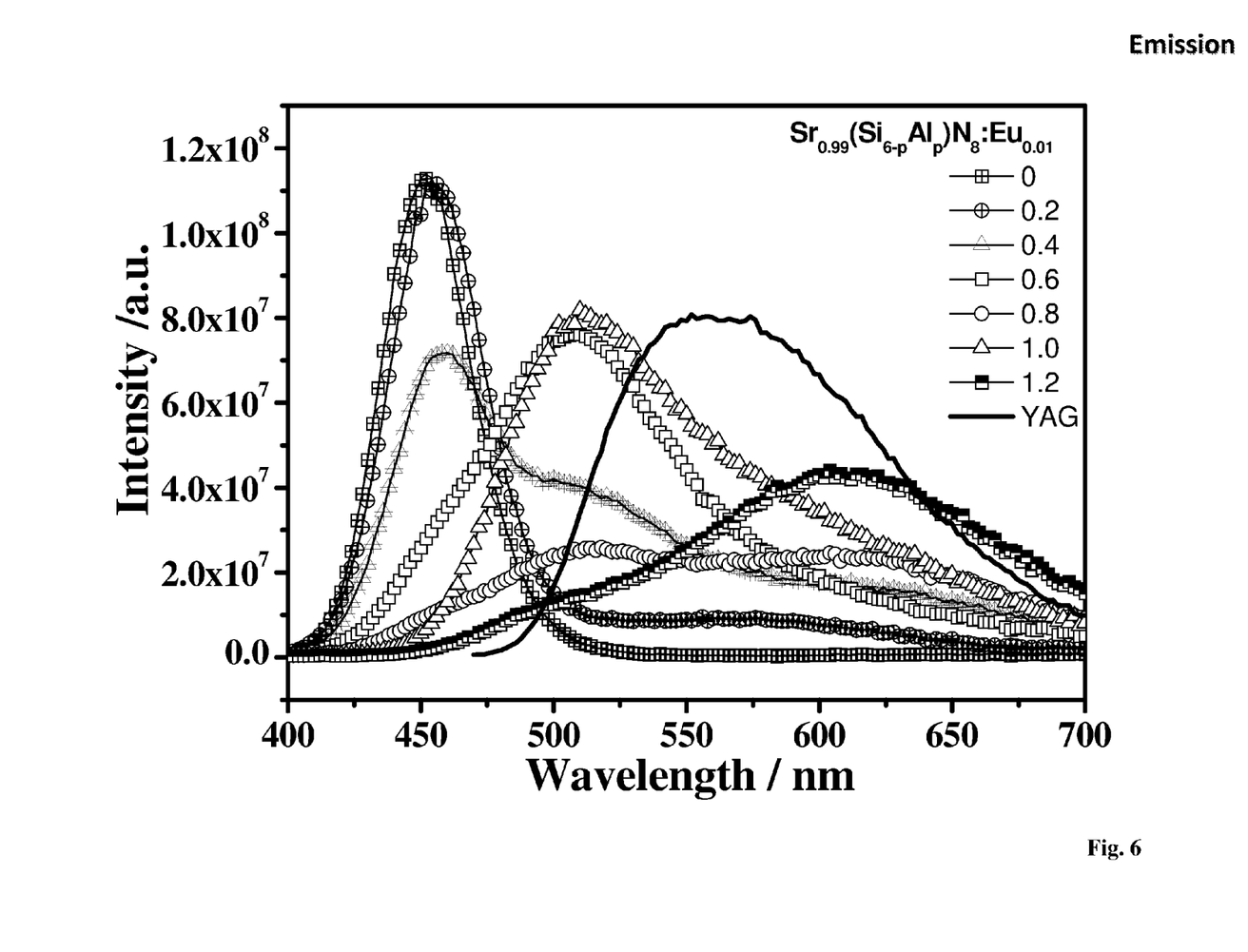
FIG. 6 is a chart of emission spectrums of the tunable luminescent materials prepared by the method of FIG. 1 in various embodiments.
Figure 7:
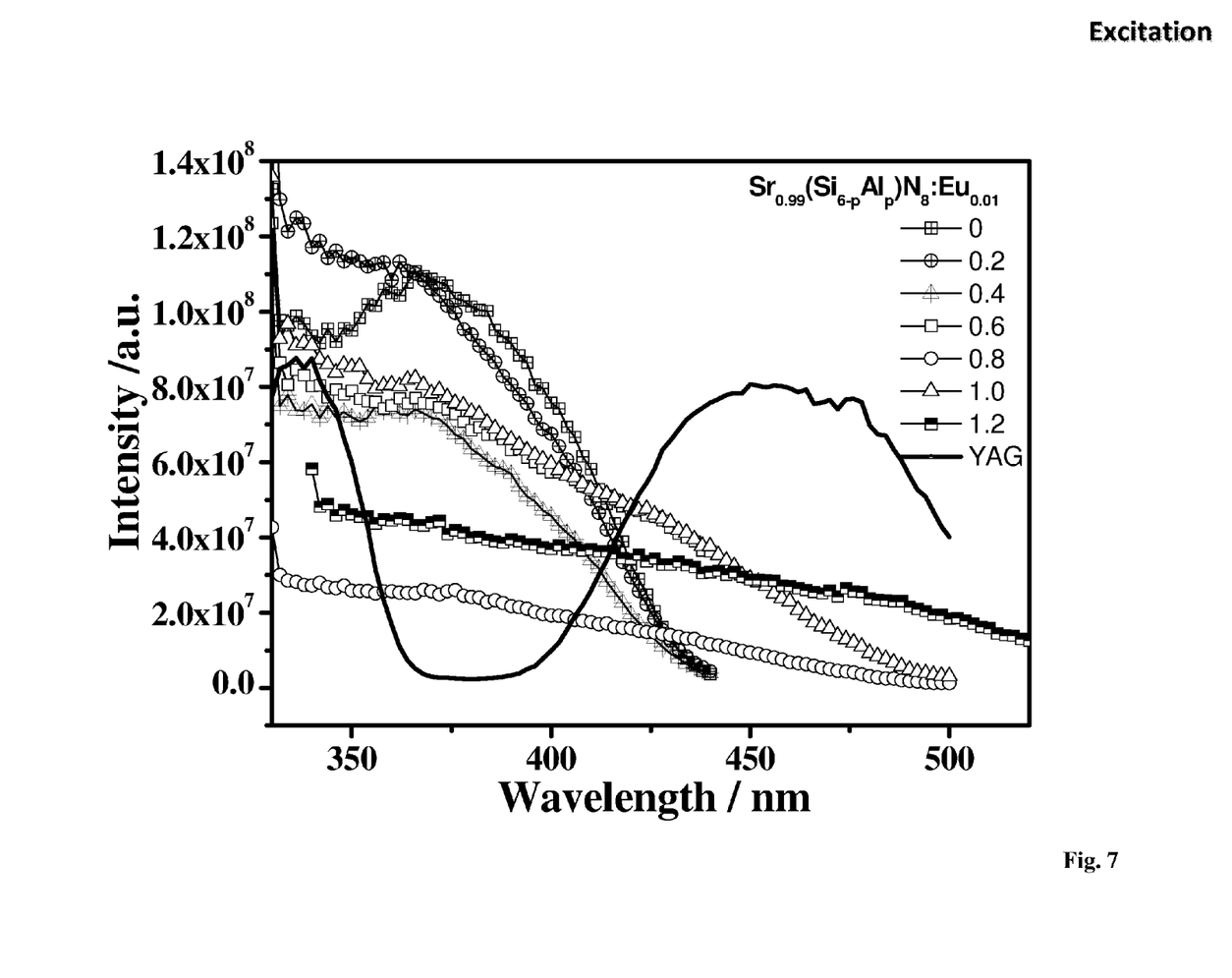
FIG. 7 is a chart of excitation spectrums of the tunable luminescent materials prepared by the method of FIG. 1 in various embodiments.

FIG. 6 further provides an emission spectrum and FIG. 7 further provides an excitation spectrum of the tunable nitridosilicate phosphor for the corresponding six examples, the reference sample without aluminum, and another reference sample of the yttrium aluminium garnet ($Y_3Al_5O_{12}:Ce^{3+}$, YAG) phosphor. The six samples are, respectively, labeled in both FIGS. 6 and 7 as 0.2, 0.4, 0.6, 0.8, 1.0, and 1.2 in the figure legends, representing the respective aluminum content (parameter p). The reference sample of nitridosilicate phosphor without aluminum is labeled as 0 and the YAG reference sample is labeled as YAG. In both FIGS. 6 and 7, the horizontal axis is wavelength in nm, and the vertical axis is intensity in arbitrary units.

Figure 2:
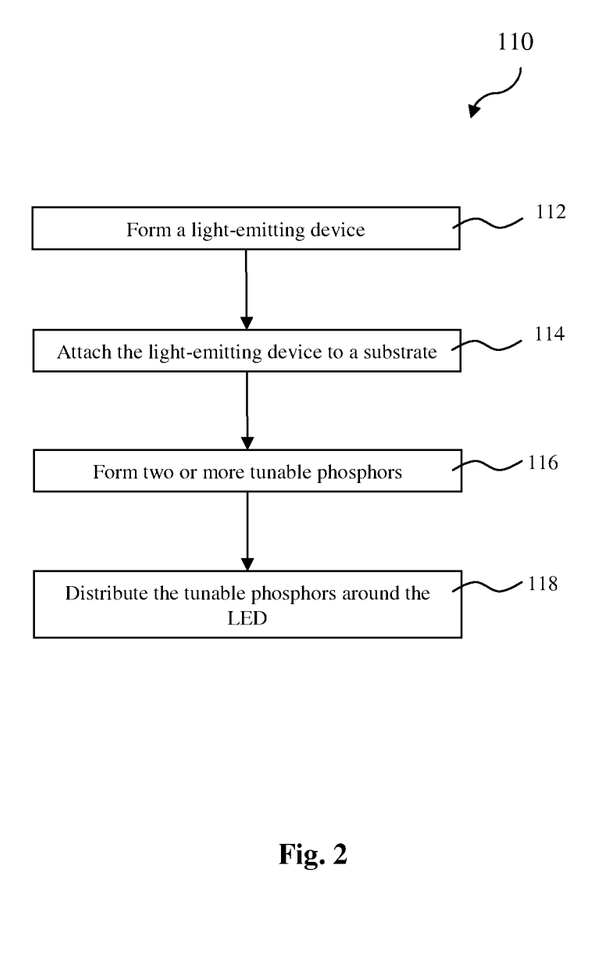
FIG. 2 is a flowchart of a method for forming a radiation device constructed according to various aspects of the present disclosure in one or more embodiments.
Figure 8:
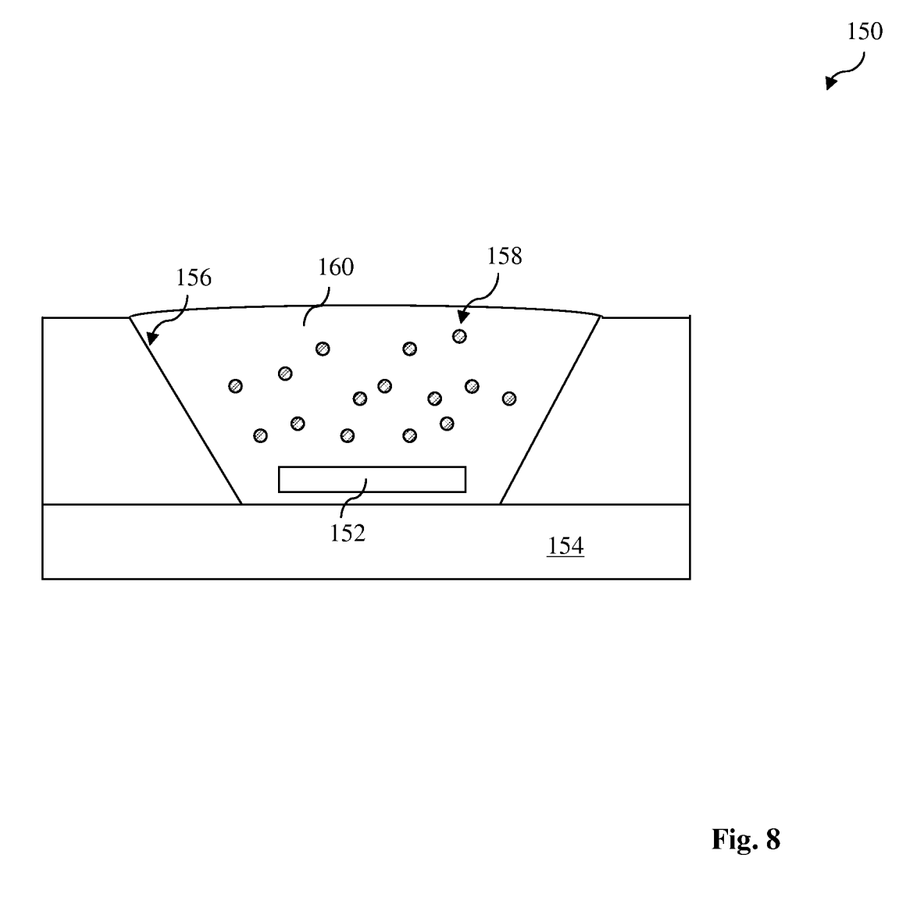
FIG. 8 is a diagrammatic view of a radiation device having the tunable luminescent material formed by the method of FIG. 1.
Figure 9:
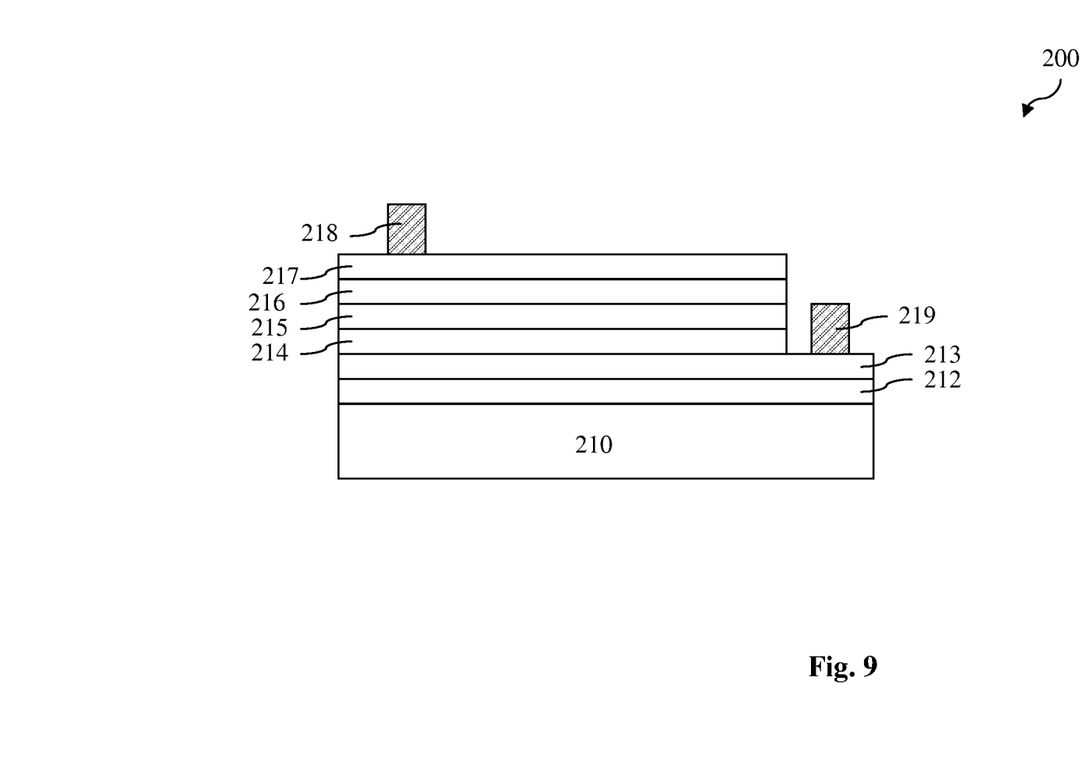
FIG. 9 is a diagrammatic view of a light-emitting diode (LED) used in the radiation device of FIG. 8.

FIG. 2 is a flowchart of a method 110 for making a radiation device. FIG. 8 is a diagrammatic view of one embodiment of a radiation device 150 using the luminescent material prepared by the method 100 of FIG. 1. FIG. 9 is a diagrammatic view of one embodiment of a light-emitting diode (LED) 200 used in the radiation device of FIG. 8. With reference to FIGS. 2, 8, and 9, the radiation device 150 and the method 110 of making the same are collectively described.

The method 110 begins at step 112 by forming or providing a light-emitting device 152, such as LED 200 of FIG. 8. The LED 200 includes a semiconductor p-n junction that can emit spontaneous radiation in ultraviolet, visual, or infrared regions of the electromagnetic spectrum. In one embodiment, the LED emits blue light having an emission peak ranging from about 430 nm to about 490 nm, such as 460 nm. The LED 200 is formed on a substrate 210, such as a sapphire, silicon carbide, gallium nitride (GaN), or silicon substrate. In the depicted embodiment, the substrate 210 is a sapphire substrate. In one embodiment, the LED 200 includes an n-type impurity doped cladding layer 213 and a p-type doped cladding layer 215 formed on the n-type doped cladding layer 213. In one embodiment, the n-type cladding layer 213 includes n-type gallium nitride (n-GaN), and the p-type cladding layer 215 includes p-type gallium nitride (p-GaN). Alternatively, the cladding layers may include GaAsP, GaPN, AlInGaAs, GaAsPN, or AlGaAs doped with respective types. The LED 200 may further include an indium gallium nitride/gallium nitride (InGaN/GaN) multi-quantum well layer 214 disposed between the n-GaN 213 and p-GaN 215. The LED 200 may further include a buffer layer 212, such as a GaN buffer layer, formed between the sapphire substrate 210 and the n-GaN 213. The LED 200 may further include an InGaN/GaN layer 216 formed on the p-GaN 216. A transparent conductive layer 217, such as indium tin oxide (ITO), is formed on the p-GaN 215, coupled to a p-electrode 218. An n-electrode 219 is formed and coupled with the n-GaN layer 213.

The LED 200 is provided for only illustration and may vary in various applications. Further, the light emitting device 152 is not limited to the LED. Other types of light emitting devices may be additionally or alternatively formed or used. The light-emitting device 152 may include other features such as a drive circuit integrated in an integrated circuit chip.

Referring back to FIGS. 2 and 8, the method 110 proceeds to step 114 by attaching the light-emitting device 152 to a support substrate 154. The support substrate 154 includes a conductive material, such as copper or aluminum. The light-emitting device 152 is attached to the support substrate 154 through an adhesive layer, such as a conductive adhesive layer. In one or more examples, the light-emitting device 152 is attached to the support substrate 154 through a silver paste or solder. In various embodiments, with reference to FIG. 9, the LED 200 as the light-emitting device 152 is configured with the substrate 154 such that the p-electrode 218 and the n-electrode 219 are properly routed to power lines. Alternatively, more than one light-emitting device may be attached to the support substrate 154 to achieve multiple excitations. In another embodiment, one or more reflective surfaces 156 are configured to the support substrate 154 to effectively reflect light and enhance radiation efficiency.

Still referring to FIGS. 2 and 8, the method 110 proceeds to step 116 by forming or providing a luminescent material 158 (or phosphor). The phosphor 158 is formed by the method 100. The phosphor 158 is formed or provided in powder. The phosphor 158 emits visual light tunable from red to blue under excitation. The nitridosilicate phosphor 158 is a tunable nitridosilicate phosphor doped by a rare earth element and having an emission spectrum tunable by the content of the aluminum composition.

The tunable luminescent material is represented by the formula $(AE)Si_{6-p}Al_pN_8:RE_z$. In one embodiment, the tunable luminescent material is represented by the formula $(Sr_{1-x-y}Ca_xBa_y)_{1-z}Si_{6-p}Al_pN_8:RE_z$. The parameter p is greater than zero. In one embodiment, the parameter p is less than about 1.2, formulated as $0<p\leq1.2$. In another embodiment, the parameter p is less than about 3, formulated as $0<p\leq3$. In yet another embodiment, the parameter x ranges between 0 and 1, formulated as $0\leq x\leq1$, and the parameter y ranges between 0 and 1, formulated as $0\leq y\leq1$. In yet another embodiment, the parameter z ranges between about 0.001 and about 0.4, formulated as $0.001\leq z\leq0.4$.

Since the phosphor 158 is tunable, the emission light can be tuned to various spectrum according to the application. For example, for white illumination, the phosphor 158 is designed with proper aluminum content to emit blue and red light, or blue and yellow and red light. Furthermore, the phosphor 158 includes one or more tunable nitridosilicate phosphors $(Sr_{1-x-y}Ca_xBa_y)_{1-z}Si_{6-p}Al_pN_8:RE_z$, each with different aluminum content (or different p), respectively formed by the method 100 and collectively distributed around the light-emitting device 152. For example, the phosphor 158 includes first tunable nitridosilicate phosphors $(Sr_{1-x-y}Ca_xBa_y)_{1-z}Si_{6-p}Al_pN_8:RE_z$ with the aluminum content p tuned to emit blue light and second tunable nitridosilicate phosphors $(Sr_{1-x-y}Ca_xBa_y)_{1-z}Si_{6-p}Al_pN_8:RE_z$ with the aluminum content p tuned to emit red light. In another example, the phosphor 158 includes first tunable nitridosilicate phosphors $(Sr_{1-x-y}Ca_xBa_y)_{1-z}Si_{6-p}Al_pN_8:RE_z$ with the aluminum content p=0.2 (such as the sample 2 in FIG. 3) and second tunable nitridosilicate phosphors $(Sr_{1-x-y}Ca_xBa_y)_{1-z}Si_{6-p}Al_pN_8:RE_z$ with the aluminum content p=1.2 (such as the sample 7 in FIG. 3). Instead of using different types of phosphors, the same type tunable nitridosilicate phosphors $(Sr_{1-x-y}Ca_xBa_y)_{1-z}Si_{6-p}Al_pN_8:RE_z$ with different aluminum contents (different p) are used in the light-emitting device 150, tunable for various applications.

Still referring to FIGS. 2 and 8, the method 110 proceeds to step 118 by distributing the luminescent material 158 around the light-emitting device 152. In one embodiment, the luminescent material 158 is dispersed in epoxy 160 disposed around the light-emitting device 152, as illustrated in FIG. 8. In another embodiment, the luminescent material 158 is directly disposed on the light-emitting device 152. In yet another embodiment, the luminescent material 158 is remotely disposed around the light-emitting device 152. For example, the luminescent material 152 is separated from the light-emitting device 152 by an encapsulation material. The method 110 may further include other processing steps such as other packaging steps.

Thus, the present disclosure provides an illuminating system including a light emitting diode (LED); and a tunable luminescent material disposed approximate the light-emitting device, wherein the tunable luminescent material includes alkaline earth metal (AE) and silicon aluminum nitride doped by a rare earth element (RE), formulated as $(AE)Si_{6-p}Al_pN_8$, wherein p is a parameter defining a relative aluminum content in weight and p is greater than zero.

In one embodiment of the illuminating system, the alkaline earth metal includes strontium (Sr), calcium (Ca), barium (Ba), or a combination thereof. In another embodiment, the tunable luminescent material is formulated as $(Sr_{1-x-y}Ca_xBa_y)_{1-z}Si_{6-p}Al_pN_8:RE_z$; and parameters x, y, and z are relative composition contents in weight. In another embodiment, the parameters x, y, z, and p ranges are $0\leq x\leq1$, $0\leq y\leq1$, $0.001\leq z\leq0.4$ and $0<p\leq3$, respectively. In yet another embodiment, the parameter p is less than or equal to 1.2. In yet another embodiment, the tunable luminescent material is activated by europium ($Eu^{2+}$) and is formulated as $(Sr_{1-x-y}Ca_xBa_y)_{1-z}Si_{6-p}Al_pN_8:Eu^{2+}_z$. The tunable luminescent material emits light tunable from red to blue by the parameter p. In another embodiment, the light-emitting device includes an emission spectrum with a peak ranging from 440 nm to 650 nm. In yet another embodiment, the tunable luminescent material has an excitation spectrum tunable by the parameter p and the excitation spectrum ranges from about 300 nm to about 500 nm. The tunable luminescent material may be embedded in epoxy around the LED. The LED may include an indium gallium nitride (InGaN) LED.

The present disclosure also provide an embodiment of a tunable luminescent material. The tunable luminescent material includes a rare earth element doped nitridosilicate phosphor formulated as $(AE)_zSi_{1-p}Al_pN_8:RE_z$, where AE is one of calcium (Ca), strontium (Sr), barium (Ba), and a combination thereof; RE is a rare earth element; z is $0.001\leq z\leq0.4$; and p is $0<p\leq3$.

In one embodiment of the tunable luminescent material, the rare earth element doped nitridosilicate phosphor includes $(Sr_{1-x-y}Ca_xBa_y)_{1-z}Si_{6-p}Al_pN_8:Eu_z$; x ranges between 0 and 1; and y ranges between 0 and 1. In one embodiment, the tunable luminescent material includes an excitation spectrum peak ranging from 300 nm to 500 nm. In another embodiment, the tunable luminescent material includes an emission spectrum peak ranging from 440 nm to 650 nm.

The present disclosure also provides a method including mixing stoichiometrically powdered strontium nitride ($Sr_3N_2$), silicon nitride ($Si_3N_4$), aluminum nitride (AlN), and europium nitride (EuN), thereby forming a mixture free of oxide; and sintering the mixture under a high pressure and a high temperature, thereby forming a tunable luminescent material having a strontium silicon aluminum nitride.

In one embodiment of the method, the high pressure ranges from about 0.7 MPa to about 1.2 MPa under a nitrogen atmosphere. In another embodiment, the high temperature ranges between about 1700° C. and about 2300° C., and the sintering includes a sintering duration greater than about 0.5 hour. In another embodiment, the mixing stoichiometrically powdered $Sr_3N_2$, $Si_3N_4$, AlN, and EuN includes mixing stoichiometrically powdered $Sr_3N_2$, calcium nitride ($Ca_3N_2$), barium nitride ($Ba_3N_2$), $Si_3N_4$, AlN, and EuN. In yet another embodiment, the mixing stoichiometrically powdered $Sr_3N_2$, $Si_3N_4$, AlN, and EuN includes mixing powdered $Sr_3N_2$, $Si_3N_4$, and AlN with weights of about 25.45 to about 25.85, about 71.94 to about 60.45, and about 2.19 to about 13.25, respectively.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An illuminating system comprising:
   a light emitting diode (LED); and
   a tunable luminescent material disposed approximate the light emitting diode, wherein the tunable luminescent material includes alkaline earth metal (AE) and silicon aluminum nitride doped by a rare earth element (RE), formulated as $(AE)Si_{6-p}Al_pN_8$, wherein p is a parameter defining a relative aluminum content in weight and p is greater than zero, wherein the alkaline earth metal includes strontium (Sr), calcium (Ca), barium (Ba), or a combination thereof, and wherein the tunable luminescent material is formulated as $(Sr_{1-x-y}Ca_xBa_y)_{1-z}Si_{6-p}Al_pN_8:RE_z$; and parameters x, y, and z are relative composition contents in weight.

2. The illuminating system of claim 1, wherein the parameters x, y, z, and p ranges are $0 \leq x \leq 1$, $0 \leq y \leq 1$, $0.001 \leq z \leq 0.4$, and $0 \leq p \leq 3$, respectively.

3. The illuminating system of claim 2, wherein p is less than or equal to 1.2.

4. The illuminating system of claim 1, wherein the tunable luminescent material is activated by europium ($Eu^{2+}$) and is formulated as $(Sr_{1-x-y}Ca_xBa_y)_{1-z}Si_{6-p}Al_pN_8:Eu^{2+}_z$.

5. The illuminating system of claim 1, wherein the tunable luminescent material emits light tunable from red to blue by the parameter p.

6. The illuminating system of claim 1, wherein the light emitting diode includes an emission spectrum with a peak ranging from 440 nm to 650 nm.

7. The illuminating system of claim 1, wherein the tunable luminescent material has an excitation spectrum tunable by the parameter p and the excitation spectrum ranges from about 300 nm to about 500 nm.

8. The illuminating system of claim 1, wherein the tunable luminescent material is embedded in epoxy around the LED.

9. The illuminating system of claim 1, wherein the LED includes an indium gallium nitride (InGaN) LED.

10. A tunable luminescent material comprising:
    a rare earth element doped nitridosilicate phosphor formulated as $(AE)_zSi_{1-p}Al_pN_8:RE_z$, where AE is one of calcium (Ca), strontium (Sr), barium (Ba), and a combination thereof; RE is a rare earth element; z is $0.001 \leq z \leq 0.4$; and p is $0 \leq p \leq 3$.

11. The tunable luminescent material of claim 10, wherein the rare earth element doped nitridosilicate phosphor includes $(Sr_{1-x-y}Ca_xBa_y)_{1-z}Si_{6-p}Al_pN_8:Eu_z$; x ranges between 0 and 1; and y ranges between 0 and 1.

12. The tunable luminescent material of claim 10, comprising an excitation spectrum peak ranging from 300 nm to 500 nm.

13. The tunable luminescent material of claim 10, comprising an emission spectrum peak ranging from 440 nm to 650 nm.

14. The tunable luminescent material of claim 10, wherein an emission spectrum and the excitation spectrum of the luminescent material are tunable with an aluminum content of the luminescent material.

15. The tunable luminescent material of claim 10, wherein the luminescent material is embedded in epoxy.

16. A method, comprising:
    mixing stoichiometrically powdered strontium nitride ($Sr_3N_2$), silicon nitride ($Si_3N_4$), aluminum nitride (AlN), and europium nitride (EuN), thereby forming a mixture free of oxide; and
    sintering the mixture under a high pressure and a high temperature, thereby forming a tunable luminescent material having a strontium silicon aluminum nitride.

17. The method of claim 16, wherein the high pressure ranges from about 0.7 MPa to about 1.2 MPa under a nitrogen atmosphere.

18. The method of claim 16, wherein the high temperature ranges between about 1700° C. and about 2300° C., and the sintering includes a sintering duration greater than about 0.5 hour.

19. The method of claim 16, wherein the mixing stoichiometrically powdered $Sr_3N_2$, $Si_3N_4$, AlN, and EuN includes mixing stoichiometrically powdered $Sr_3N_2$, calcium nitride ($Ca_3N_2$), barium nitride ($Ba_3N_2$), $Si_3N_4$, AlN, and EuN.

20. The method of claim 16, wherein the mixing stoichiometrically powdered $Sr_3N_2$, $Si_3N_4$, AlN, and EuN includes mixing powdered $Sr_3N_2$, $Si_3N_4$, and AlN with weights of about 25.45 to about 25.85, about 71.94 to about 60.45, and about 2.19 to about 13.25, respectively.

21. The method of claim 16, further comprising distributing the tunable luminescent material around a light emitting diode (LED).

* * * * *